United States Patent [19]

Duijkers

[11] 4,410,814

[45] Oct. 18, 1983

[54] SIGNAL BUFFER CIRCUIT IN AN INTEGRATED CIRCUIT FOR APPLYING AN OUTPUT SIGNAL TO A CONNECTING TERMINAL THEREOF

[75] Inventor: Peter A. Duijkers, Nijmegen, Netherlands

[73] Assignee: U.S. Philips Corporation, New York, N.Y.

[21] Appl. No.: 288,249

[22] Filed: Jul. 29, 1981

[30] Foreign Application Priority Data

Aug. 19, 1980 [NL] Netherlands .......................... 8004675

[51] Int. Cl.³ .................. H03K 19/092; H03K 17/60; H03F 3/26
[52] U.S. Cl. .................................. 307/475; 307/255; 330/267
[58] Field of Search ....................... 307/255, 254, 475; 330/263, 264, 267

[56] References Cited

U.S. PATENT DOCUMENTS

| | | | |
|---|---|---|---|
| 3,332,027 | 7/1967 | Suganuma | 330/260 |
| 4,239,989 | 12/1980 | Brajder | 307/255 |
| 4,287,435 | 9/1981 | Cavaliere et al. | 307/255 |

Primary Examiner—John S. Heyman
Assistant Examiner—Timothy P. Callahan
Attorney, Agent, or Firm—Thomas A. Briody; William J. Streeter; Edward W. Goodman

[57] ABSTRACT

A buffer circuit in an integrated circuit for applying to a connecting terminal thereof an output signal the polarity of which depends on a voltage to which an external load resistor is connected, the other end of this load resistor being connected to the terminal. The circuit comprises two output transistors arranged in series with two current measuring impedances for measuring the direction of the current flowing through the load resistor and for cutting off one of the output transistors.

3 Claims, 1 Drawing Figure

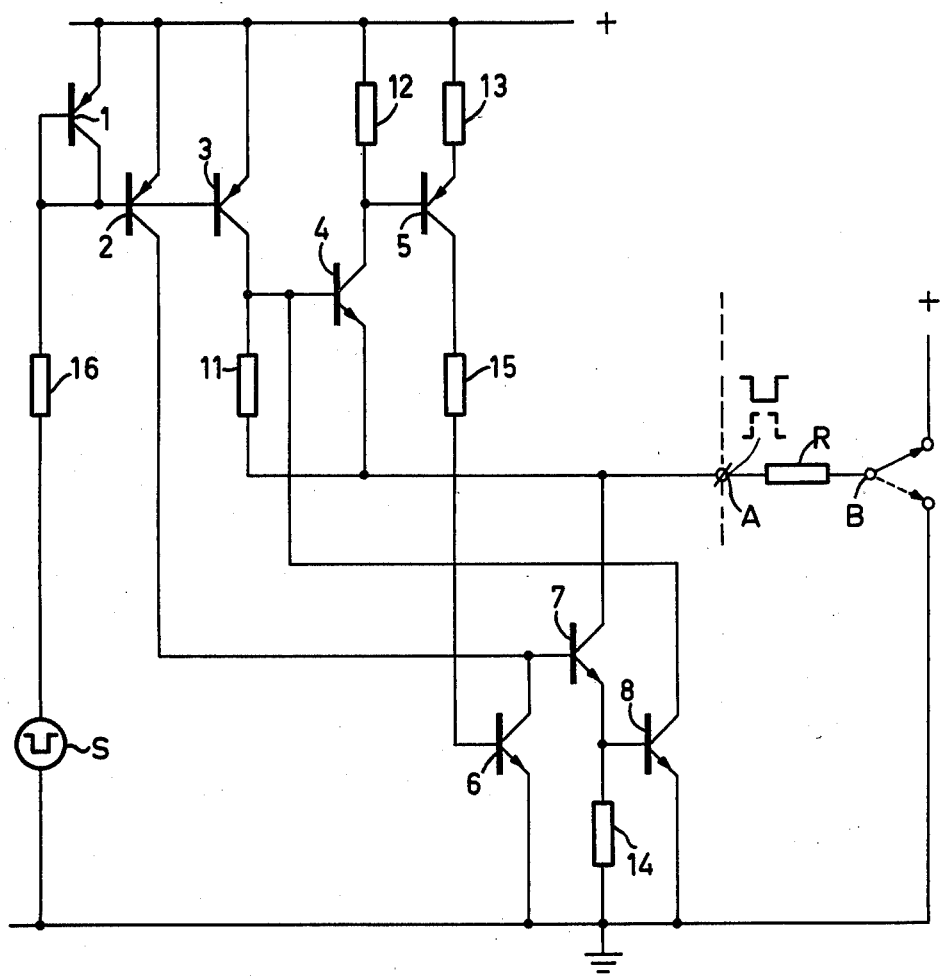

SIGNAL BUFFER CIRCUIT IN AN INTEGRATED CIRCUIT FOR APPLYING AN OUTPUT SIGNAL TO A CONNECTING TERMINAL THEREOF

BACKGROUND OF THE INVENTION

The invention relates to a signal buffer circuit in an integrated circuit for applying an output signal to a connecting terminal of the integrated circuit which also comprises an input signal source, including a series arrangement of a first and a second output transistor connected between the terminals of a supply voltage, a first output electrode of the first output transistor and a first output electrode of the second output transistor being connected to the connecting terminal, and a first driving transistor having a control electrode connected to the input signal source and a first output electrode connected to the control electrode of the first output transistor, a load resistor which is externally connected to the terminal, being connected to either a first voltage whereby the first output transistor conducts while the second output transistor is cut off and whereby the output signal has the same polarity as the input signal, or to a second voltage whereby the second output transistor conducts while the first output transistor is cut off and whereby the polarity of the output signal is opposite to that of the input signal.

Such a circuit is disclosed in Applicants' U.S. Patent Application Ser. No. 944,333, filed Sept. 21, 1978, now U.S. Pat. No. 4,282,447. In this known circuit, the input signal is applied to the base of the driving transistor, which passes signals having the same amplitude and opposite polarities to the output transistors. The output transistors are of the opposite conductivity types, their emitters are interconnected and connected to the connecting terminal. If the load resistor is connected to a positive or to a negative voltage then one of the output transistors conducts, whereby the voltage at the connecting terminal assumes such a value that the other output transistor cannot be conductive.

So a train of pulses having a polarity which can be chosen from outside the integrated circuit is generated with the known circuit. In view of the symmetry of the circuit the driving transistor must, however, be set to approximately half the supply voltages, so that the output voltage is less than this half. In practice, it will be still lower. The circuit is not suitable for uses in which a high amplitude is required, as the output signal at the connecting terminal would have to be amplified while it may have either the one or the other polarity. In addition, if the input signal is not a train of pulses but a direct voltage level, then the two possible output signals are two direct voltage levels between which the difference may be too small to enable a clear distinction.

SUMMARY OF THE INVENTION

The invention has for its object to provide a circuit of the above-mentioned type by means of which an output signal with either the one or the other polarity can be obtained, however with a much higher value. According to the invention, the circuit is characterized in that the control electrode of a second driving transistor is connected to the input signal source and a first output electrode of the second driving transistor is connected to the control electrode of the second output transistor, in that the second output electrode of the first output transistor is connected to a first current measuring impedance for measuring the direction of the current flowing through the load resistor and for driving a third driving transistor for cutting off the second output transistor is necessary and in that the second output electrode of the second output transistor is connected to a second current measuring impedance for driving a fourth driving transistor for cutting off the first output transistor if necessary.

DESCRIPTION OF THE DRAWING

The invention will now be further described by way of non-limitative example with reference to the accompanying drawing, the sole FIGURE of which shows an embodiment of the circuit of the invention.

DESCRIPTION OF THE PREFERRED EMBODIMENT

In the FIGURE, reference numeral 1 denotes a pnp transistor whose base and collector are interconnected and connected to the base of a pnp transistor 2 as well as to that of a pnp transistor 3. The emitters of the transistors 1, 2, 3 are connected to a positive 12 V supply line. The collector of transistor 3 is connected to the base of an npn transistor 4, the collector of which is connected to the base of a pnp transistor 5. The collector of transistor 3 is also connected, by means of a resistor 11 having a value of 10 kΩ, to a terminal A to which also the emitter of transistor 4 is connected. A 3.9 kΩ resistor 12 is included between the collector of transistor 4 and the supply line and a 400 Ω resistor 13 is included between the emitter of transistor 5 and the supply line.

The collector of transistor 2 is connected to the collector of an npn transistor 6 and to the base of an npn transistor 7. The collector of transistor 7 is connected to terminal A while the emitter thereof is connected to the base of an npn transistor 8 and to a 2.7 kΩ resistor 14. The collector of transistor 8 is connected to the base of transistor 4 while the emitter of transistor 8 and also the emitter of transistor 6 and the terminal of resistor 14, which is not connected to transistor 7, are connected to ground. Finally, the collector of transistor 5 is connected to the base of transistor 6 by means of a 12 kΩ resistor 15.

The circuit of the FIGURE is part of an integrated circuit of which A is a connecting terminal. An external resistor R having a value of some dozens of kΩ may be connected to terminal A. The other terminal B of resistor R may be connected to either a positive line, for example the supply voltage supplying energy to the described circuit, or to ground.

An internal source S of negatively-going pulses is connected to the bases of transistors 1, 2 and 3 by means of a 110 kΩ resistor 16. If terminal B is connected to ground, then negatively going pulses are available at terminal A. If, in contrast therewith, terminal B is connected to the positive voltage, then the signal at terminal A consists of positively going pulses. The preceding may be explained as follows.

In the absence of source S, transistor 2 and 3 are cutoff. Transistors 4 and 7 do not receive a base current, so that they are also cutoff, as are also the other transistors in the circuit. Consequently, the impedance between terminal A and ground is very high. The value thereof is equal to the value of resistor R, if this resistor is connected.

If terminal B is connected to the positive voltage, terminal A has initially the same positive potential as point B. In the presence of source S the signal thereof becomes low at a certain instant, in response to which transistors 2 and 3 are rendered conductive. The collector current of transistor 2 controls the base of transistor 7, which is also rendered conductive, causing the voltage at point A to decrease because of the collector current of transistor 7. The emitter current of transistor 7 produces a voltage drop across resistor 14, which becomes so high that also transistor 8 becomes conductive. The collector current of transistor 3 flows through transistor 8 which prevents transistor 4 from becoming conductive. Also the transistors 5 and 6 remain non-conducting. From the foregoing, it will be apparent that for the period of time the signal of source S is low, the voltage at point A is also low. The value of this voltage is equal to the sum of the threshold voltages of the base-emitter diode of transistor 8 and the collector-emitter voltage of transistor 7, and is, consequently, slightly below 1 V. If the signal from the source S is pulse-shaped, the voltage at terminal A is also pulse-shaped, the amplitude of this signal being slightly higher than 11 V.

For the case that terminal B is connected to ground, terminal A has ground potential in the absence of a signal. As soon as the signal from source S becomes low, transistors 2 and 3 become conductive. The collector current of transistor 3 controls the base of transistor 4, which is also rendered conductive, causing the voltage at point A to increase because of the emitter current of transistor 4. The collector current of transistor 4 produces a voltage drop across resistor 12 which becomes so high that also transistor 5 becomes conductive and the collector current thereof renders transistor 6 conductive. The collector current of transistor 2 flows through transistor 6, having for its result that transistor 7 cannot become conductive. Also transistor 8 remains in the cutoff state. From the foregoing, it will be apparent that the voltage at point A is high during the period of time the signal from source S is low. The difference between this voltage and the supply voltage is equal to the sum of the threshold voltage of the base emitter diode of transistor 4 and the collector-emitter voltage of transistor 3 and is, consequently, slightly lower than 1 V. So also in this case the amplitude of the pulse-shaped signal available at terminal A is slightly higher than 11 V.

From the foregoing it is apparent that, when resistor R is connected to the positive voltage transistors 2, 7 and 8 are conductive, transistor 8, which receives its collector current via the conducting transistor 3, maintains transistor 4 and, consequently, also transistors 5 and 6 in the non-conducting state. In a similar manner transistors 3, 4 and 6 conduct, if resistor R is connected to ground, transistor 6, which receives its collector current via the conducting transistor 2, maintaining transistor 7 and, consequently, transistor 8 in the non-conducting state, transistor 5 and resistor 15 having being added in view of the direct voltage levels of transistors 4 and 6.

The value of resistor R can be chosen at one's option. It has been found that the circuit operates in a satisfactory manner if the value of resistor R is taken between approximately 12 and 100 kΩ, while the pulses generated by source S have the television field frequency of 50 or 60 Hz with a pulse duration of 1.4 ms. The circuit is also suitable for the line frequency, albeit with a slightly different rating. The pulses at terminal A can be taken off by means of a capacitor. By means of an isolation diode it is accomplished that resistor R does not continuously load a further circuit. To this end the diode must be connected with the suitable direction of conduction to terminal A, that is to say by means of its anode, if point B is connected to ground and by means of its cathode, if point B is connected to the supply voltage. The output pulses can be passed on to a circuit for field or line blanking. An alternative use of the circuit shown in the FIGURE is in the muting circuit of an intermediate frequency amplifier. Source S then generates, in a known manner, a direct voltage level.

It will be obvious that variants of the circuit of the FIGURE are possible, which are within the framework of the invention. So it is, for example, possible to replace the current measuring resistor 12 and 14, respectively, with which the direction of the output current is measured by a diode which is rendered conductive by this current. Transistors of a certain conductivity type may be replaced in known manner by transistors of the opposite conductivity type.

What is claimed is:

1. A signal buffer circuit for providing and interface between a connecting terminal of an integrated circuit and an external circuit, said signal buffer circuit including a series arrangement of a first and a second output transistor connected between terminals of a supply voltage source, a first electrode of said first output transistor and a first electrode of said second output transistor being connected to the connecting terminal; a first driving transistor having a control electrode connected to an input signal source on said integrated circuit and a first output electrode connected to a control electrode of said first output transistor; and a load resistor external to said integrated circuit for alternatively coupling said connecting terminal to a first or a second biasing voltage in which said first biasing voltage causes said first output transistor to conduct and said second output transistor to be cut off while said second biasing voltage causes said first output transistor to be cut off and said second output transistor to conduct; characterized in that said signal buffer circuit further comprises a second driving transistor having a control electrode connected to said input signal source and a first output electrode connected to a control electrode of said second output transistor; a first current measuring impedance connected between one of said supply voltage source terminals and a second electrode of said first output transistor for measuring the direction of current flowing through said load resistor; a third driving transistor having a control electrode connected to the junction of said first current measuring impedance and said second electrode of said first output transistor, and a first output electrode coupled to the control electrode of said second output transistor for cutting off said second output transistor in dependence on said current; a second current measuring impedance connected between the other of said supply voltage source terminals and a second electrode of said second output transistor; and a fourth driving transistor having a control electrode connected to the junction of said second current measuring impedance and said second electrode of said second output transistor, and a first output electrode coupled to said control electrode of said first output transistor for cutting off said first output transistor in dependence on said current.

2. A signal buffer circuit as claimed in claim 1, characterized in that a second output electrode, respectively, of said first, second and third driving transistors are each connected to said one of the supply voltage source terminals.

3. A signal buffer circuit as claimed in claim 1, characterized in that a second output electrode of said fourth driving transistor is connected to said other of the supply voltage source terminals.

* * * * *